United States Patent
Kolics et al.

(10) Patent No.: US 9,353,444 B2
(45) Date of Patent: May 31, 2016

(54) TWO-STEP DEPOSITION WITH IMPROVED SELECTIVITY

(71) Applicant: Lam Research Corporation, Fremont, CA (US)

(72) Inventors: Artur Kolics, Dublin, CA (US); Praveen Nalla, Fremont, CA (US); Seshasayee Varadarajan, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/225,020

(22) Filed: Mar. 25, 2014

(65) Prior Publication Data
US 2015/0275374 A1  Oct. 1, 2015

(51) Int. Cl.
C23C 18/18 (2006.01)
H01L 21/768 (2006.01)
C23C 18/16 (2006.01)
C23C 18/31 (2006.01)
C23C 18/50 (2006.01)

(52) U.S. Cl.
CPC ......... C23C 18/1831 (2013.01); C23C 18/1653 (2013.01); C23C 18/31 (2013.01); C23C 18/50 (2013.01); H01L 21/76874 (2013.01); H01L 21/76879 (2013.01); H01L 21/76885 (2013.01); H01L 21/76871 (2013.01)

(58) Field of Classification Search
CPC .......... H01L 21/76879; H01L 21/76874; H01L 23/53238; H01L 21/76871; H01L 21/76885; H01L 21/7685; H01L 21/76867; C23C 18/50; C23C 18/1831; C23C 18/1653; C23C 18/32; C23C 18/54; C23C 18/1651; C23C 15/31
USPC ......................................... 438/678
See application file for complete search history.

(56) References Cited

U.S. PATENT DOCUMENTS

| | | | |
|---|---|---|---|
| 6,905,622 B2 | 6/2005 | Padhi et al. | |
| 7,972,652 B2 | 7/2011 | Ivanov et al. | |
| 2003/0189026 A1* | 10/2003 | Padhi ................... | C23C 18/1694 216/89 |
| 2005/0014359 A1* | 1/2005 | Segawa ................... | C23C 18/50 438/622 |

* cited by examiner

Primary Examiner — Caleen Sullivan
(74) Attorney, Agent, or Firm — Beyer Law Group LLP

(57) ABSTRACT

A method for providing an electroless plating over at least one copper containing layer is provided. Surfaces of the at least one copper containing layer are sealed by selectively depositing a sealing layer of catalytically active metal on the at least one copper containing layer. The sealing layer is exposed to an electroless deposition bath that is more reactive to the catalytically active metal than to the at least one copper containing layer to provide an electroless deposition on the sealing layer.

18 Claims, 2 Drawing Sheets

TWO-STEP DEPOSITION WITH IMPROVED SELECTIVITY

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. This may be done by depositing copper or a copper alloy into features etched into the low-k dielectric layer. The deposited copper may be deposited by electrodeposition or by electroless deposition.

SUMMARY OF THE INVENTION

To achieve the foregoing and in accordance with the purpose of the present invention, a method for providing an electroless plating over at least one copper containing layer is provided. Surfaces of the at least one copper containing layer are sealed by selectively depositing a sealing layer of catalytically active metal on the at least one copper containing layer. The sealing layer is exposed to an electroless deposition bath that is more reactive to the catalytically active metal than to the at least one copper containing layer to provide an electroless deposition on the sealing layer.

In another manifestation of the invention a method for providing an electroless plating over at least one copper containing layer is provided. Surfaces of the at least one copper containing layer are sealed by selectively depositing a sealing layer of catalytically active metal on the at least one copper containing layer, comprising exposing the at least one copper containing layer to a sealing bath comprising a borane containing component, which provides an electroless deposition of a catalytically active metal. The sealing layer is exposed to a borane free electroless deposition bath comprising a phosphorous containing component, wherein the electroless deposition bath is more reactive to the catalytically active metal than to the at least one copper containing layer to provide an electroless deposition on the sealing layer, and wherein the sealing bath is more reactive to copper than the electroless deposition bath.

In another manifestation of the invention, sealing bath for sealing copper layers is provided, comprising a borane containing component, a metal containing reagent comprising ions of at least one of Co, Ni, and Pd, citric acid monohydrate, and boric acid.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Electroless plating of copper to fill etched features has advantages over electroplating of copper. Electroless plating is able to deposit metal on a thinner seed layer and does not suffer from ohmic potential drop because of the thin seed layer requirement. Electroless plating can easily scale to larger wafer diameters. In addition, electroless plating allows plating on the full face of the wafer and provides more versatility in workable liner materials, not only allowing for liners of cobalt (Co), ruthenium (Ru), and copper (Cu), but also allowing liners deposited by physical vapor deposition (PVD), chemical vapor deposition (CVD), and atomic layer deposition (ALD).

As the industry moves towards thinner features and thinner liner/seed/barrier, the advantages provided by electroless plating are more attractive. However, electroless plating has disadvantages when compared with electroplating, such as a possible increase in defects if copper is dissolved into the bath during electroless plating over copper.

Figure 1:
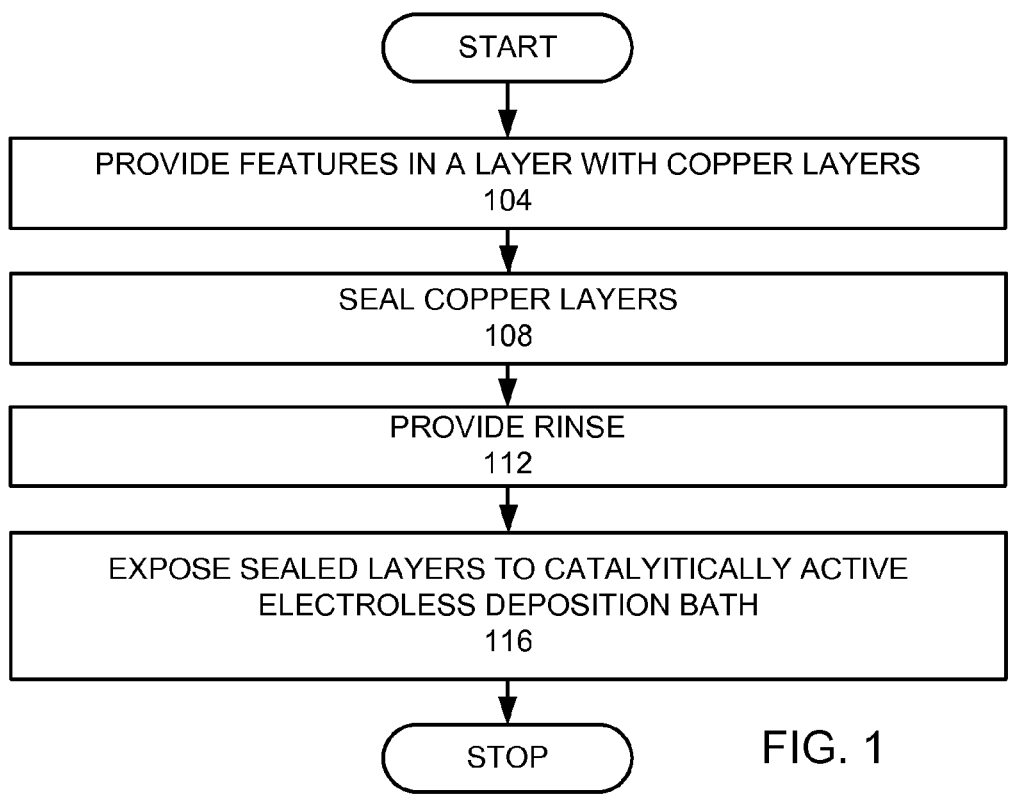
FIG. 1 is a flow chart of an embodiment of the invention.

FIG. 1 is a high level flow chart of an embodiment of the invention. In this embodiment, features with at least one copper containing layer are provided in a layer of a stack (step 104). The copper containing layers are sealed (step 108). A rinse is provided (step 112). The sealed copper containing layers are exposed to a catalytically active electroless deposition bath (step 116).

Figure 2A:
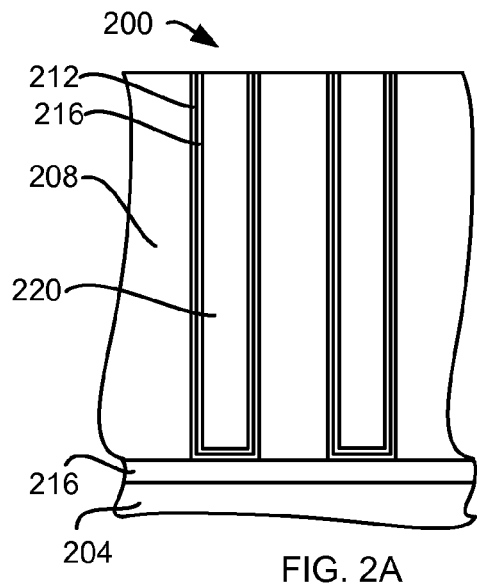
FIGS. 2A-C are schematic views of the formation of structures using the inventive process.

In a preferred embodiment of the invention, features with at least one copper containing layer is provided in a dielectric layer (step 104). FIG. 2A is a schematic cross-sectional view of a stack 200 with a substrate 204 with a dielectric layer 208 with features filled with at least one copper containing layer 220. In this example, the copper containing layer 220 is a copper or copper alloy contact. In this example, one or more layers 216 are disposed between the substrate 204 and the dielectric layer 208. In this example, a barrier layer 212 and a seed layer 216 are disposed between the copper containing layer 220 and the dielectric layer 208. Preferably, the dielectric layer 208 is a low-k dielectric layer, with a k value of less than 4.0. In this embodiment, the dielectric layer 208 is organosilicate glass (OSG).

Figure 2B:
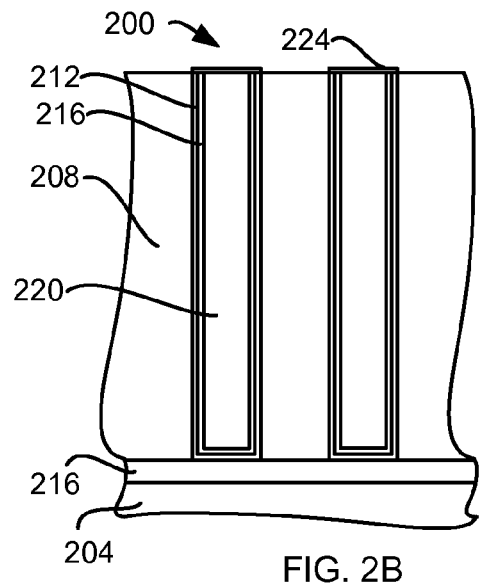

The at least one copper containing layer is sealed (step 108). In this example, an electroless deposition in an oxygen free environment is used to seal the at least one copper containing layer 220 by depositing a layer of a catalytically active metal over the at least one copper containing layer. An example of a bath for the electroless deposition of the sealing layer consists essentially of 40-50 mM cobalt sulfate heptahydrate, 140-160 mM citric acid monohydrate, 75-150 mM boric acid, 25-40 mM dimethylamine borane at a pH of 9, adjusted by tetramethylammonium hydroxide. More generally, the bath has a borane containing reagent and a catalytically active metal ion. Borane causes a bath to be more highly reactive to copper. Preferably, the catalytically active metal ion is one of Co, Ni, or Pd. Preferably, the thickness of the seal is between 10 Å to 100 Å thick. More preferably, the layer of the seal is between 10 Å to 70 Å thick. FIG. 2B is a schematic cross-sectional view of the stack 200 after a sealing layer 224 is deposited over the at least one copper containing layer 220. The sealing layer 224 is kept thin to minimize the deposition time. Such a catalytically active metal deposition dissolves some of the copper which may redeposit causing defects. By providing a short deposition time, the defects are minimized. Because copper is dissolved into the solution during the deposition process, the solution is discarded periodically to reduce defects. In one example, the solution is discarded after each wafer.

In other examples, atomic layer deposition (ALD) or chemical vapor deposition (CVD) is used to seal the copper containing layer. Such a deposition would deposit a layer of catalytically active metal, such as Co, Ni, or Pd over the surface of the copper containing layer.

The stack 200 is subjected to a rinse (step 112). The rinse may be a deionized water (DI) rinse. In some examples, a rinse is not provided. The rinse removes homogenously formed metal particles or dissolved copper ions/particles that are redeposited and may be a source of defects.

Figure 2C:
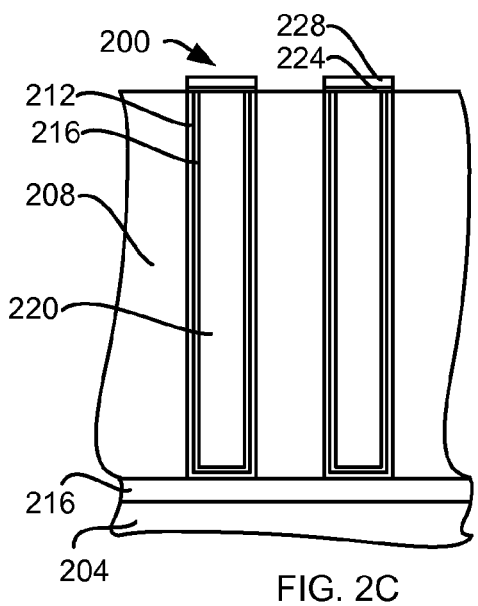

The stack 200 is exposed to an electroless deposition bath that is more reactive to catalytically active metal than to the at least one copper containing layer 220. An example of such an electroless deposition provides a bath consisting essentially of 40-50 mM cobalt sulfate heptahydrate, 140-160 mM citric acid monohydrate, 75-150 mM boric acid, 100-200 mM ammonium hypophosphite at a pH of 9, adjusted by tetramethylammonium hydroxide. More generally, the bath has a phosphorous containing reducing agent, such as hypophosphite, and a catalytically active metal ion. With a hypophosphite reducing agent, the bath does not plate on copper, but will plate on Co, Ni, or Pd. Preferably, the deposited catalytically active metal layer is greater than 100 Å thick. Since the at least one copper containing layer 220 is sealed, copper does not dissolve into the deposition solution, reducing related defects. Since there are fewer defects, the stack 200 may be subjected to the electroless deposition bath for a longer period of time to provide a thicker deposition layer. FIG. 2C is a schematic cross-sectional view of the stack 200 after a catalytically active metal layer 228 is deposited over the at least one copper containing layer 220 and the deposited sealing layer 224.

In an example of the invention, the at least one copper containing layer is pure copper. In this example, the at least one copper containing layer forms copper contacts. In other examples, the at least one copper containing layer may be a layer over a surface of a wafer.

Some of the embodiments of the invention provide a seal over copper contacts that prevents the formation of a copper oxide. An embodiment of the invention provides an electroless deposition so that small features are covered with reduced defects.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing an electroless plating over at least one copper containing layer, comprising:
   sealing surfaces of the at least one copper containing layer by selectively depositing a sealing layer of catalytically active metal on the at least one copper containing layer;
   exposing the sealing layer to an electroless deposition bath that is more reactive to the catalytically active metal than to the at least one copper containing layer to provide an electroless deposition on the sealing layer.

2. The method, as recited in claim 1, wherein the sealing surfaces of the copper containing layers, comprises at least one of atomic layer deposition, chemical vapor deposition, or electroless deposition.

3. The method, as recited in claim 1, wherein the sealing surfaces of the copper containing layers comprises exposing the copper containing layers to a sealing bath that provides an electroless deposition of a catalytically active metal, wherein the sealing bath is more reactive to copper than the electroless deposition bath.

4. The method, as recited in claim 3, wherein the sealing bath comprises a borane containing component.

5. The method, as recited in claim 4 wherein the electroless deposition is borane free and comprises a phosphorous containing component.

6. The method, as recited in claim 5, wherein the sealing layer comprises at least one of Co, Ni, or Pd.

7. The method, as recited in claim 6, wherein the sealing layer is between 10 Å and 100 Å thick.

8. The method, as recited in claim 7, rinsing the sealing layer before exposing the sealing layer to the electroless deposition bath.

9. The method, as recited in claim 8, wherein the sealing is oxygen free.

10. The method, as recited in claim 8, wherein the electroless deposition deposits at least one of Co, Ni, or Pd.

11. The method, as recited in claim 4, wherein the sealing layer comprises at least one of Co, Ni, or Pd.

12. The method, as recited in claim 4, wherein the sealing layer is between 10 Å and 100 Å thick.

13. The method, as recited in claim 4, rinsing the sealing layer before exposing the sealing layer to the electroless deposition bath.

14. The method, as recited in claim 4, wherein the sealing is oxygen free.

15. The method, as recited in claim 4, wherein the electroless deposition deposits at least one of Co, Ni, or Pd.

16. The method, as recited in claim 1, wherein the sealing layer comprises at least one of Co, Ni, or Pd.

17. The method, as recited in claim 1, wherein the sealing layer is between 10 Å and 100 Å thick.

18. A method for providing an electroless plating over at least one copper containing layer, comprising:
   sealing surfaces of the at least one copper containing layer by selectively depositing a sealing layer of catalytically active metal on the at least one copper containing layer, comprising exposing the at least one copper containing layer to a sealing bath comprising a borane containing component and that provides an electroless deposition of a catalytically active metal;
   exposing the sealing layer to a borane free electroless deposition bath comprising a phosphorous containing component, wherein the electroless deposition bath is more reactive to the catalytically active metal than to the at least one copper containing layer to provide an electroless deposition on the sealing layer, and wherein the sealing bath is more reactive to copper than the electroless deposition bath.

* * * * *